United States Patent [19]

Taormina et al.

[11] 4,076,358

[45] Feb. 28, 1978

[54] LAMP SOCKET FOR PRINTED CIRCUIT

[75] Inventors: Anthony J. Taormina; Artur Wyszynski, both of Detroit; Roman J. Witek, East Trenton, all of Mich.

[73] Assignee: Essex Group, Inc., Fort Wayne, Ind.

[21] Appl. No.: 781,620

[22] Filed: Mar. 28, 1977

[51] Int. Cl.$^2$ ............................................. H05K 1/12

[52] U.S. Cl. .............................. 339/17 D; 339/127 R

[58] Field of Search ............. 339/17 D, 119 L, 126 R, 339/126 RS, 127 R

[56] References Cited

U.S. PATENT DOCUMENTS

| | | | |
|---|---|---|---|
| 3,798,588 | 3/1974 | Howe et al. | 339/17 D X |
| 3,873,176 | 3/1975 | Moore | 339/127 R X |
| 3,949,217 | 4/1976 | Howe et al. | 339/127 R X |

*Primary Examiner*—Roy Lake
*Assistant Examiner*—E. F. Desmond
*Attorney, Agent, or Firm*—Lawrence E. Freiburger; Robert D. Sommer

[57] ABSTRACT

A lamp socket assembly adapted for use with a printed circuit. The lamp socket assembly of the invention includes a tubular socket portion which receives and retains the lamp and which also is attached to a base member in a conventional manner. The tubular socket portion also includes a plurality of longitudinal flanges which cooperate with corresponding notches in an aperture in the printed circuit board to allow the socket to be locked onto the printed circuit board by inserting it and twisting it. The novel feature of a lamp socket in accordance with the invention lies in the inclusion of a resilient ring around the tubular socket portion which provides a biasing force to urge the socket away from the printed circuit board so that the frictional engagement of the flanges and the printed circuit holds it in place.

2 Claims, 9 Drawing Figures

LAMP SOCKET FOR PRINTED CIRCUIT

BACKGROUND OF THE INVENTION

In the prior art, lamp socket assemblies have been provided which are mountable on printed circuit boards. While the prior art devices have generally been satisfactory, they have usually been deficient in one aspect or another. For example, some prior art lamp socket assemblies are mountable on the printed circuit by inserting them and actuating a separate latch mechanism. Others are mountable by inserting the socket into the printed circuit board and latched by twisting it. However, this type of prior art lamp socket suffers from the drawback that it is necessary to deactuate the latching mechanism before removal. Other prior art lamp socket assemblies have suffered from the drawback that they easily come loose and eventually actually fall out.

Accordingly, it is an object of the present invention to provide a lamp socket assembly which is easily assembled and connected to a printed circuit and which can easily be removed but yet which is adequately retained.

SUMMARY OF THE INVENTION

This object as well as others which will become more apparent as the description of the invention proceeds are accomplished by the lamp socket of the invention which is comprised of a base member and a lamp socket portion which cooperate with one another to retain a plurality of electric terminals for making electrical contact between the lamp bulb and the printed circuit. The two piece lamp socket of the invention also includes means for latching the socket on the printed circuit in the form of a plurality of longitudinal flanges on the outside of the tubular socket portion which cooperate with corresponding notches in an aperture in the printed circuit board to allow the socket to be inserted into the aperture and then latched in place by twisting it. A novel biasing means acts to urge the socket away from the printed circuit board so as to frictionally retain the socket in its latched position. In a first embodiment of the invention, the biasing means comprises an O-ring constructed of resilient material and seated in a skirt member formed integrally with the socket forming portion. In a second embodiment of the invention, the biasing means comprises a skirt member which is integral with the socket portion.

BRIEF DESCRIPTION OF THE DRAWINGS

During the course of the detailed description of the invention reference will be made to the drawings in which.

DETAILED DESCRIPTION OF THE INVENTION

Figure 1:
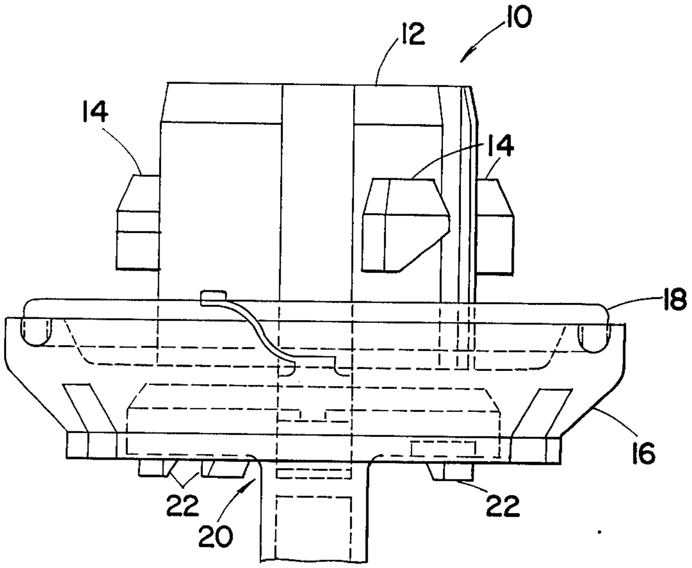
FIG. 1 is an elevational view of a lamp socket in accordance with the invention.
Figure 2:
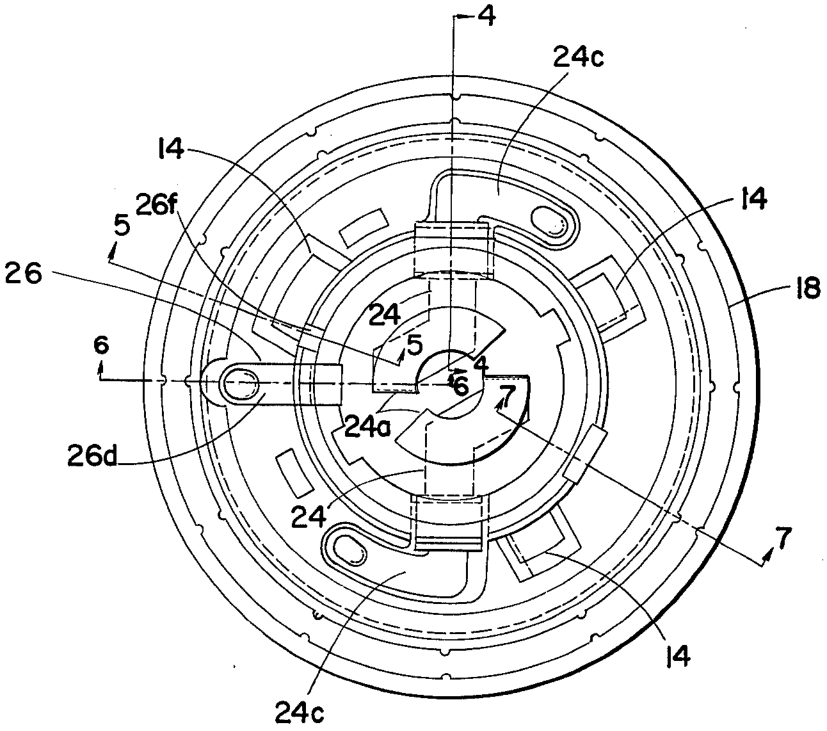
FIG. 2 is a top elevational view of a lamp socket in accordance with the present invention.
Figure 3:
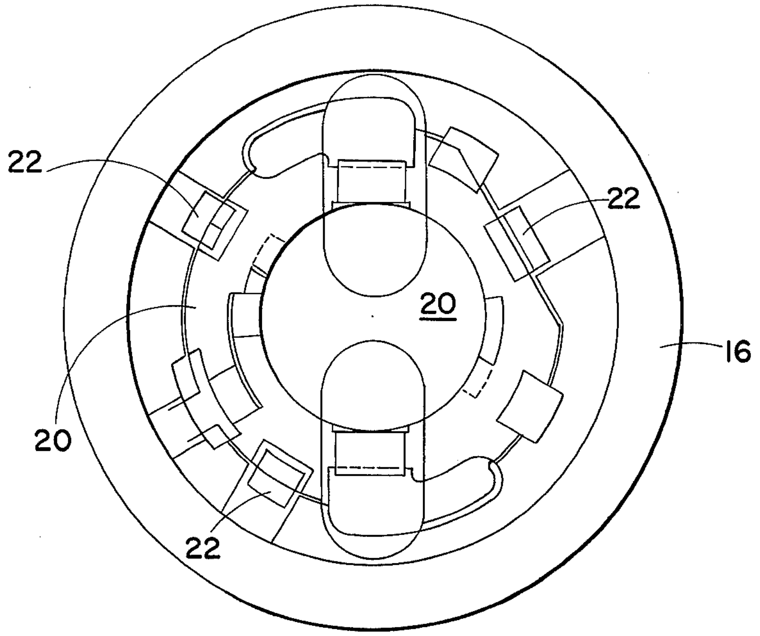
FIG. 3 is a bottom elevational view of a lamp socket in accordance with the present invention.

Referring now to the drawing FIGURES and particularly FIGS. 1–7, a lamp socket assembly, generally indicated by reference numeral 10, includes a tubular socket portion 12 which is adapted to receive an appropriate light bulb (not shown). The socket portion 12 further includes a plurality of locking flanges 14 spaced around the outside thereof, the purpose of which will be hereinafter described. Also, formed integrally with the tubular socket portion is a skirt member 16 which forms a seat for an O-ring member 18.

Figure 4:
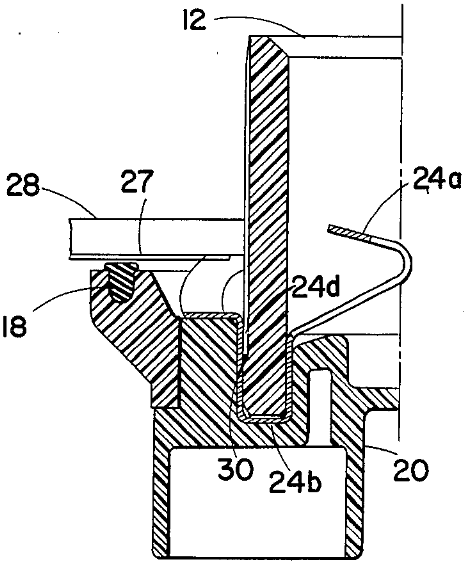
FIGS. 4–7 are sectional views taken along the lines indicated in FIG. 2.
Figure 5:
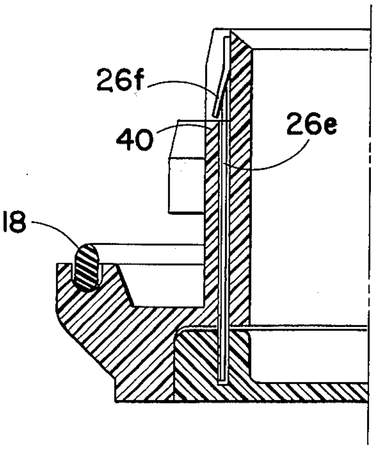
Figure 6:
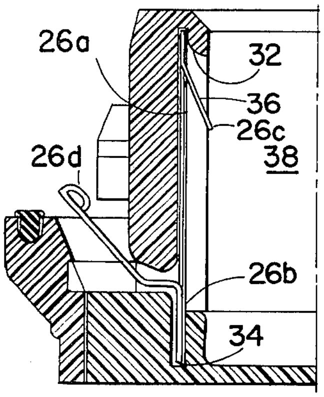

The lamp socket assembly of the invention also includes a base member, generally indicated by reference numeral 20, which is latched to the socket portion 12 by a plurality of resilient latching fingers 22. When latched together, the base member and socket portion cooperate to hold a plurality of resilient electrical terminals in place. The electrical terminals are substantially conventional in design, so they will not be described in detail. It should therefore suffice to say that the lamp socket assembly depicted in the drawings has a pair of identical filament terminals 24 and a ground terminal 26. The filament terminals 24 are of one piece construction and include a bent end formed to provide a bulb contacting portion **24*a*, located in the bottom of the tubular socket portion 12, an intermediate portion 24*b* which seats in an appropriate recess in the base member 20, and a circuit board contacting portion 24*c* which contacts the conductor 27 on a printed circuit board 28, as shown in FIG. 4. The terminals 24 are held in place by the cooperation of the socket portion 12 and base member 20 and by a locking tang 24*d* which cooperates with a shoulder 30 on the tubular socket portion 12. The ground terminal 26 is also held in place by the cooperation of the socket portion 12 and base member 20. It will be seen that the ground terminal includes an upwardly extending portion 26*a* seated in a slot like recess 32 in socket member 12, a downwardly extending portion 26*b* seated in recess 34 in base member 20, a contact tang 26*c* extending into the cavity 38 formed by the socket portion, and a circuit board contacting portion 26*d* for making contact to the ground conductor on the printed circuit board. In addition, the ground terminal 26 includes a second leg 26*e* which has a locking tang 26*f* near its upper end which cooperates with an abutment shoulder 40** on the socket portion so as to prevent removal of the terminal.

Figure 7:
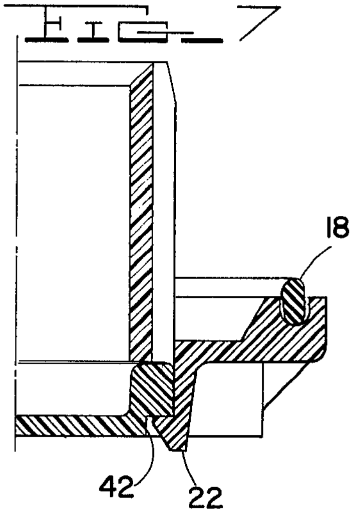

Referring to FIG. 7, it will be seen that the resilient locking tabs 22 cooperate with corresponding recesses 42 in base member 20 to latch the socket 12 and base member 20 together.

Figure 8:
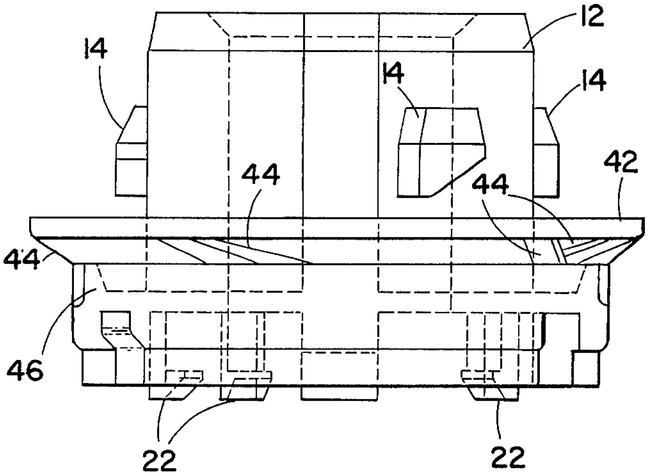
FIGS. 8 and 9 are elevational views of an alternate embodiment of the invention.
Figure 9:
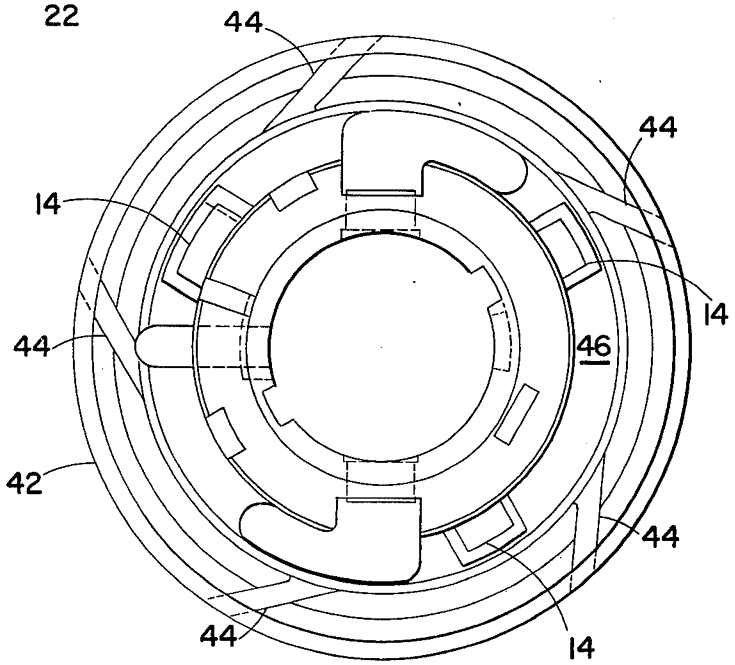

An alternate embodiment of the socket portion is shown in FIGS. 8 and 9. The difference between the socket portion of FIGS. 8 and 9 and the earlier embodiment lies in the skirt indicated by reference numeral 42 which replaces the O-ring of the previous embodiment. The resilient skirt 42 is located concentrically around the tubular socket portion 12 and is integrally attached thereto by a plurality of resilient tabs 44. It will be noted that the tabs 44 extend from an integral collar 46 around the socket portion to the concentric skirt 42 in a non-radial fashion. By doing this rather than radial tabs, the tab length is increased to decrease the amount of bending done by the tabs for the same amount of movement by the skirt.

In operation, the lamp socket is assembled by placing the terminals in their proper places and latching the socket portion 12 and base member 20 together. The socket assembly is then inserted into a suitable aperture in a printed circuit board and twisted to latch the assembly onto the printed circuit board. It will be seen that the latching is accomplished by longitudinal flange members 14 which are insertable into corresponding notches in the aperture in the printed circuit board, and which prevent removal of the assembly until it is rotated back to its original position. The O-ring 18 and skirt 42 provide mechanical biasing for the assembly so that the printed circuit board is frictionally engaged between the bottom of flanges 14 and the O-ring 18 or skirt member 42. The lamp bulb is then inserted into the socket and retained therein in a conventional manner.

One advantageous feature of the lamp socket assembly of the invention, is the fact that the terminals 24 and ground terminal 26 are all retained on the tubular socket portion 12, independently of base portion 20. For example, it is noted that ground terminal 26 is retained on tubular socket portion 12 by resilient tang **26*f* which prevents extraction of the ground terminal toward the base portion 20. Further, tang 24*d* on terminals 24 cooperates with shoulder 30 on the tubular socket portion to prevent extraction of terminals 24 in a direction toward the base portion. Thus, it is even possible to remove the base portion 20** while the socket is installed without disturbing the lamp bulb.

It is believed that the above-described socket assembly obviates all the objections of prior art socket assemblies. Further, it is intended that the above noted description of the invention be made for illustrative purposes only. The invention is defined in the claims.

What is claimed is:

1. A lamp socket assembly adapted to be mounted on one side of a printed circuit with a tubular portion thereof extending through a notched aperture in said printed circuit, which comprises:

a tubular socket portion adapted to receive a light bulb having a filament and means for making electrical connections to said filament;

a base member adapted to be latched to said socket portion;

a plurality of longitudinal flanges on the outside of said tubular socket portion to be inserted into said aperture and twisted to lock said socket assembly on said printed circuit board;

a first unitary electric terminal located in said socket assembly, said first electric terminal including a bulb contacting portion extending into said tubular socket portion and a second portion extending outwardly from said socket portion and adapted to make electrical contact to a first conductor on said printed circuit board;

a second unitary electrical terminal located in said socket assembly, said second electrical terminal including a bulb contacting portion extending into said tubular socket portion and a second portion extending outwardly from said socket portion and adapted to make electrical contact to a second conductor on said printed circuit board;

said first and second unitary electrical terminals being mounted upon said tubular socket portion independently of said base portion; and integral biasing means on said socket portion for urging said socket assembly away from its locked position.

2. A lamp socket assembly adapted to be mounted on one side of a printed circuit with a tubular socket receiving portion extending axially through an aperture in said printed circuit board, which comprises:

a tubular socket forming portion;

first electrical terminal means retained on said tubular socket receiving portion for making electrical contact to a first contact on a lamp bulb located in said socket;

second electrical terminal means retained on said tubular socket receiving portion for making electrical contact to a second contact on said lamp bulb located in said socket;

said first and second electrical terminal means each including means for making electrical contact to a conductor on said printed circuit board;

a base member attached to said tubular socket portion; and said first and second electrical terminal means being retained on said tubular socket forming portion independently of said base member.

* * * * *